(12) United States Patent
Sharad et al.

(10) Patent No.: US 8,477,550 B2
(45) Date of Patent: Jul. 2, 2013

(54) PASS-GATED BUMP SENSE AMPLIFIER FOR EMBEDDED DRAMS

(75) Inventors: Shailendra Sharad, Greater Noida (IN); Rupak Kundu, Greater Noida (IN); G. Penaka Phani, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 138 days.

(21) Appl. No.: 12/857,330

(22) Filed: Aug. 16, 2010

(65) Prior Publication Data

US 2011/0273923 A1 Nov. 10, 2011

(30) Foreign Application Priority Data

May 5, 2010 (IN) .......................... 1061/DEL/2010

(51) Int. Cl.
*G11C 7/02* (2006.01)
(52) U.S. Cl.
USPC ........... 365/207; 365/202; 365/205; 365/154; 365/149
(58) Field of Classification Search
USPC .................. 365/207, 202, 205, 154, 149, 203
See application file for complete search history.

(56) References Cited

U.S. PATENT DOCUMENTS

| | | | | |
|---|---|---|---|---|
| 3,953,839 A * | 4/1976 | Dennison et al. | ............ | 365/154 |
| 5,847,600 A * | 12/1998 | Brooks et al. | .................... | 330/9 |
| 5,856,940 A * | 1/1999 | Rao | ................. | 365/149 |
| 6,031,754 A * | 2/2000 | Derbenwick et al. | ......... | 365/145 |
| 6,181,620 B1 * | 1/2001 | Agata et al. | .................... | 365/203 |
| 6,185,256 B1 * | 2/2001 | Saito et al. | .................... | 375/257 |
| 6,225,834 B1 * | 5/2001 | Gang | ............................. | 327/55 |
| 6,359,802 B1 * | 3/2002 | Lu et al. | .......................... | 365/63 |
| 6,370,060 B2 * | 4/2002 | Takata et al. | ............. | 365/185.21 |
| 6,842,375 B1 * | 1/2005 | Raszka | .................... | 365/185.18 |
| 6,885,574 B2 * | 4/2005 | Torrisi et al. | .................. | 365/145 |
| 7,177,203 B2 * | 2/2007 | Moriyama | ............... | 365/189.09 |
| 7,196,954 B2 * | 3/2007 | Suh | ................. | 365/207 |
| 7,236,415 B2 * | 6/2007 | Forbes et al. | .................. | 365/207 |
| 8,116,157 B2 * | 2/2012 | Bruennert et al. | ............ | 365/205 |
| 8,125,844 B2 * | 2/2012 | Kang et al. | .................... | 365/203 |
| 8,169,812 B2 * | 5/2012 | Lynch | ........................... | 365/149 |

* cited by examiner

*Primary Examiner* — Viet Q Nguyen
(74) *Attorney, Agent, or Firm* — Hogan Lovells US LLP

(57) ABSTRACT

A sensing circuit for use in a semiconductor memory device includes first and second conducting lines for conducting a bit signal to and from a memory cell. The circuit further includes a sense amplifier coupled to the first and second conducting lines for sensing a bit signal, a charge storing element for generating a predefined potential, and first and second switching element respectively coupled to the first and second conducting lines. The first and second switching elements are selectively controllable to connect the first and second conducting line to the charge storing element so as to induce the generated predefined voltage on the first or second conducting lines.

29 Claims, 11 Drawing Sheets

PASS-GATED BUMP SENSE AMPLIFIER FOR EMBEDDED DRAMS

RELATED APPLICATION

The present application claims priority of India Provisional Application No. 1061/DEL/2010 filed May 6, 2010, which is incorporated herein it its entirety by this reference.

FIELD OF THE INVENTION

The present invention relates to circuits for use in semiconductor memory devices and in particular to a sensing circuit for sensing a bit signal transferred from/to a memory cell of a memory device. Further, the invention relates to a memory circuit and a semiconductor memory device using the sensing circuit.

BACKGROUND OF THE INVENTION

Semiconductor memory devices include a plurality of columns formed by a first conducting line and a second complementary conducting line. Bit signals are stored in memory cells connected to one of the bit lines. Each memory cell usually includes a switch, which may be a transistor, and a capacitor for storing the bit signal. The switch selectively connects the memory cell to a bit line. The capacitor of each cell is at a high supply voltage or at a low voltage, according to whether the cell is storing a logic "1" or a logic "0". Usually, in order to reduce the effects of a large mutual capacitance between adjacent bit lines, the complementary bit lines within a given column are twisted along the length of the column.

When reading the information stored in the memory cell, the capacitor is connected to the bit line of the column. Since the bit lines are normally quite long, its capacitance is much larger than the capacitance of the cell capacitor. Therefore, the potential of the bit line will only slightly be modified by the charge of the capacitor. In order to traduce this small voltage signal in a full logic signal, semiconductor memory devices are provided with sense amplifiers.

Sense amplifiers can be implemented in memory devices according to several designs. A memory circuit 700 according to a first known design is shown in FIG. 10. The sense amplifier 710 includes a pair of cross-coupled inverters 711, 712 connected to the bit lines 701 and 702 and is switched on/off by a transistor 750 driven by a reference voltage. Before starting a read/write procedure, the bit lines are at pre-charged at ground. However, the sense amplifier 710 is only stable when one of the two bit lines is "low" and the other is "high". Because of the pre-charging to ground, a reference cell 770 is needed in order to place a reference voltage on the bit line complementary to the bit line connected to the memory cell.

The reference cell 770 comprises two access transistors 772 and 773 and a capacitor 771. The reference cell 770 is provided at the intersection of a dummy word line WLref and the connecting line 702. The transistor 773 is turned on by activation of the dummy word line WLref, whereby the dummy capacitor 771 is electrically connected with the bit line 702. The transistor 772 is turned on by activating the signal line Pref when the dummy word line WLref is inactive, thereby electrically connecting the dummy capacitor 771 and a voltage line Vref to each other. The voltage line Vref supplies the power supply voltage $V_{dd}/2$.

During a refresh operation of the bit "0", no charge appears on the bit line 701 (equation 1.1), while the bit line 702 (complementary bit line BLC) will have a voltage given by:

$$V_{BLT}=0 \quad (1.1),$$

$$V_{BLC}=C_{mem} \cdot 0.5 \cdot V_{dd}/(C_{mem}+C_{BL}) \quad (1.2)$$

wherein $C_{mem}$ is the capacitance of the memory capacitor 762 and $C_{BL}$ is the capacitance of the bit line. On the other hand, during a refresh operation of the bit "1", the signal on the bit line 701 (true bit line BLT) is given by the equation (2.1), while the signal of on the bit line 702 is given by equation (2.2) below:

$$V_{BLT}=C_{mem} \cdot V_{dd}/(C_{mem}+C_{BL}) \quad (2.1)$$

$$V_{BLC}=C_{mem} \cdot 0.5 \cdot V_{dd}/(C_{mem}+C_{BL}) \quad (2.2).$$

Subsequently, the difference of the potential value on the bit lines 701 and 702 is sensed by the sense amplifier. At the end of the cycle, the signal Pref is fed into the gate of the transistor 772 of the reference cell 770 so as to connect Vref to the dummy capacitor 771 and pre-charge the dummy cell to Vdd/2.

The use of bit line twisting complicates the reference cell scheme. Indeed, for each region defined by a bit line twisting is needed a memory cell. Moreover, in common memory circuits half of the memory cells are connected to the first bit line 701 and half to the second bit line 702 in order to reduce the load. Therefore, the sense circuit illustrated in FIG. 10 requires a high number of reference cells and dummy word lines in order to properly function. As an example, considering a memory column with 128 rows and one twisting point at row WL63, four dummy word lines are required.

In conclusion, the structure of FIG. 10 needs a high number of dummy cells, thereby increasing the overall dimensions of the memory array. Moreover, the memory device has to de designed so as to support high voltage for driving any of the dummy rows in the reference cells. Finally, any reference cell needs a power supply for supplying Vref to the reference cell.

FIG. 11 illustrates another known scheme for a memory circuit 800 including a sense amplifier 810. The sense amplifier 810 includes a pair of cross-coupled inverters 811, 812 between the bit lines 801 and 802 and is switched on/off by a transistor 850 driven by a reference voltage. In the memory circuit 800, the bit lines 801 and 802 are pre-charged at $V_{dd}/2$.

During a refresh operation of the bit "0", the storing capacitor 861 is at zero potential and when it is connected to the bit line 801, the bit line 801 is slightly discharged and its potential is decreased by δV. After this equalization procedure, the bit line 801 will be at the potential $V_{dd}/2-\delta V$. On the contrary, the bit line 802 remains at $V_{dd}/2$. The difference in the potentials of the bit lines 801 and 802 is sensed by the sense amplifier 810 as a logical "0".

During a refresh operation of the bit "1", the storing capacitor 861 is at $V_{dd}$. When the storing capacitor 861 is connected to the bit line 801, it discharges into the bit line 801, thereby increasing the potential of the bit line 801 by δV. After equalization the bit line 801 is at a potential $V_{dd}/2+\delta V$, while the bit line 802 remains at $V_{dd}/2$. The difference in the potentials of the bit lines 801 and 802 is sensed by the sense amplifier 810 as a logical "1".

Although the structure of the memory circuit 800 of FIG. 11 is rather simple, an extra supply is needed in order to pre-charge the bit lines at $V_{dd}/2$. This causes an increase of the power consumption of the memory device. Moreover, pre-charging the bit lines at $V_{dd}/2$ also reduces the operating speed of the memory device.

A further known schema for a sense circuit is shown in FIG. 12. The memory circuit 900 has the bit lines 901 and 902 pre-charged at ground. In order to be able of correctly sense a "0" bit, while eliminating the reference cells used in the memory circuit 700 of FIG. 10, the sense amplifier 910 is "unbalanced". More precisely, the transistors constituting the sense amplifier are different so as to generate an "unbalanced" flow of current through the sense circuit 910. Accordingly, reading of a "1" bit can be differentiated from reading of a "0" bit.

The memory circuit 900 has a simple structure and does not need to pre-charge the bit lines 901 and 902 at a predefined potential. However, in order to correctly read a "0" bit, the sense amplifier has to be unbalanced. This unbalance causes an uncontrolled variation of the switching point depending on variations of the Process-Voltage-Temperature parameters (functional PVT).

The switching point is a crucial parameter that may drastically affect the performance of the sense amplifier and represents the value of bit signal on a bit line for which the amplification time is maximum. More precisely the switching point represents a "threshold" voltage that divides the range of voltages at which a data signal is read as a logic "1" from the range of voltages at which a data signal is read as a logic "0".

Moreover, at low temperatures and voltages, threshold voltage temperature inversion only occurs in the cross-coupled PMOS transistors of the sense amplifier 910, but not in the remaining components of the sense amplifier 910. Consequently, in this scheme, the standard deviation of the switching point is very high at low temperatures and voltages. Therefore, the above described sense amplifier is not suited for low voltage operations.

Summarizing, sense amplifiers common used in semiconductor memory devices either have a very complex structure which produces reliable results but cause the memory device to be bulky and increase the power consumption of the memory device, or have a simple structure but are very sensitive to variations in the PVT parameters, have a very high standard deviation of the switching point and cause an uncontrolled variation of the switching point.

SUMMARY

Given these problems with the existing technology, it would be advantageous to provide a system capable of reducing power consumption of semiconductor memory device that allows controlling of the switching point. Further, it would also be advantageous to provide a sense amplifier of reduced complexity which is capable of robustly sensing information stored in a memory cell so as to produce a logic state that can be further used by digital logic.

It is the particular approach of the present invention to generate differential voltages on two complementary data bit lines using a charge stored in a charge storing element which can be selectively connected to either on of the connection lines. This allows reducing operating time in sensing the information stored in the memory cell and reducing the complexity of the sensing circuitry, while increasing the reliability of the refresh procedure of memory cells.

In accordance with a first embodiment of the present invention, a sense circuit for use in a semiconductor memory device is provided. The sense circuit comprises a first and a second conducting line for conducting a bit signal from/to a memory cell, a sense amplifier connected to the conducting lines for sensing the conducting bit signal, a charge storing element for generating a predefined potential and a first and a second switching element connected to the conducting line. The first and second switching elements are selectively controllable to respectively connect the first and second conducting lines to the charge storing element so as to induce the generated predefined voltage on the first or second conducting line.

The present invention further relates to a memory circuit. The memory circuit comprises a plurality of memory cells selectively connectable to the sense circuit of the invention by means of the first and second connecting line.

Further, a semiconductor memory device is provided including a plurality of memory circuits according to the second embodiment of the present invention.

BRIEF DESCRIPTION OF THE DRAWINGS

The accompanying drawings are incorporated into and form a part of a specification to illustrate several embodiments of the present invention. Together with the description, these drawings serve to explain the principle of the invention. The drawings are only for the purpose of illustrating preferred and alternative examples of how the invention can be made and used and are not to be construed as limiting the invention to only the illustrated and described embodiments. Further features and advantages will become apparent from the following and more particular description of the various embodiments of the invention, as illustrated in the accompanying drawings, in which like reference numbers refer to like elements.

DETAILED DESCRIPTION OF PREFERRED EMBODIMENTS

In the following description, for explanatory purposes, specific details are set forth in order to provide a thorough understanding of the invention. However, it may be evident that the present invention can be practiced without these specific details.

Furthermore, well known structures and devices are only described in a more general form in order to facilitate the description thereof.

The problem underlying the present invention is based on the observation that existing sense amplifiers for semiconductor memory devices either require the bit lines to be pre-charged at a finite potential from an additional power line or are capable of operating with bit line pre-charged at 0 voltage at the expense of using unbalanced sense amplifiers.

However, using designs wherein the bit lines are pre-charged at a finite potential requires additional circuitry and additional signal lines for feeding the bit lines with a pre-charged potential. Consequently, memory circuits using this design are very bulky and more complex to realize. On the other hand, using memory circuits, wherein the bit lines are pre-charged at ground have a very simple structure. Because of the pre-charging to ground, in order to be able to read a "0" bit, it is necessary to use unbalanced sense amplifiers, which cause having a high standard deviation of the switching points at low temperatures and voltages and do not allow to properly control the behavior of the switching point across functional PVTs.

According to the present invention, a sense circuit with a simple design is provided, wherein the bit lines may be pre-charged at ground. The sense circuit of the invention may be implemented with a balanced sense amplifier. In order to correctly read a "0" bit, the sense circuit includes a charge storing element that, during read-out of a signal included in a memory cell, transfers a predefined charge into the bit line complementary to the bit line carrying the data signal so as to induce a finite predefined voltage onto the complementary bit line.

Since a finite potential is selectively induced on one of the bit lines by means of one charge storing element, it is no longer necessary to have dummy memory cells for pre-charging the bit lines. This allows to eliminate the "$V_{DD}/2$" power supply. Moreover, since this design may use a balanced sense amplifier, the sense circuit of the present invention allows better controlling the switching point behavior across functional PVTs, reducing the static offset on the reference bit line, and having a smaller standard deviation of the switching point at low temperatures and voltages.

Figure 1:
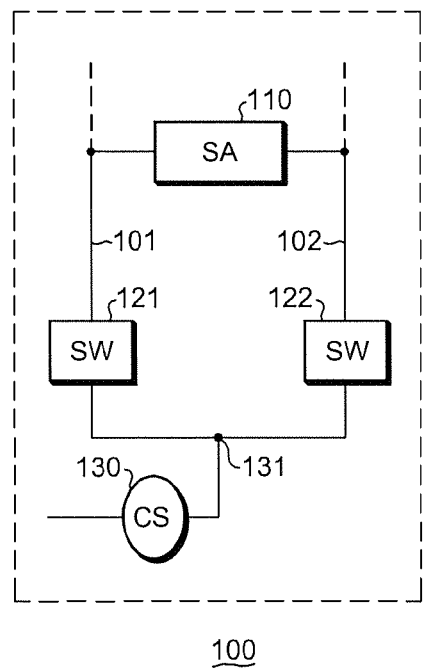
FIG. 1 is a schematic drawing illustrating a sense circuit for a semiconductor memory device in accordance with an embodiment of the present invention.

FIG. 1 illustrates an example of a sense circuit 100 according to an embodiment of the present invention. The sense circuit 100 includes a sense amplifier 110 connected to a first connecting line 101 and a second connecting line 102. The connecting lines 101 and 102 are connectable to data bit lines of a memory circuit. In particular, if the connecting line 101 is connected to a memory cell of the memory circuit, the connecting line 101 may be considered to be a "true" bit line (BLT). In this case, the connecting line 102 will be considered to be a "complementary" bit line (BLC). In particular, generally speaking, the connecting line 101 is considered to be a "true" bit line during refresh operations of memory cells that are connectable to it, and is considered a "complementary" bit line during refresh operations of memory cells connectable to the second connecting line 102. In the embodiment of FIG. 1, the connecting line 102 would therefore be a "true" line with respect to the memory cells connectable to the second connecting line 102, while the connecting line 101 will be considered "complementary" bit line with respect to the memory cells connectable to the connecting line 102.

The sense amplifier 110 is adapted to sense data signals on either the first and second bit lines 101, 102 and converts said signal to a full logic signal that can be further used by digital logic. The sense circuit 100 further includes a first and a second switching element 121, 122 respectively connected to the first connecting line 101 and the second connecting line 102. The first and second connecting lines 101 and 102 are further connected to a charge storing element 130. The charge storing element 130 may be driven by an enable signal so as to generate a potential on the node 131. At the same time, one of the switching elements 121, 122 may be selectively driven by a further enabling signal so as to selectively connect the circuit node 131 to the first conducting line 101 or the second conducting line 102. Accordingly, the first conducting line 101 or the second conducting line 102 may be put at a finite potential thereby allowing the sense amplifier correctly operating.

Figure 2:
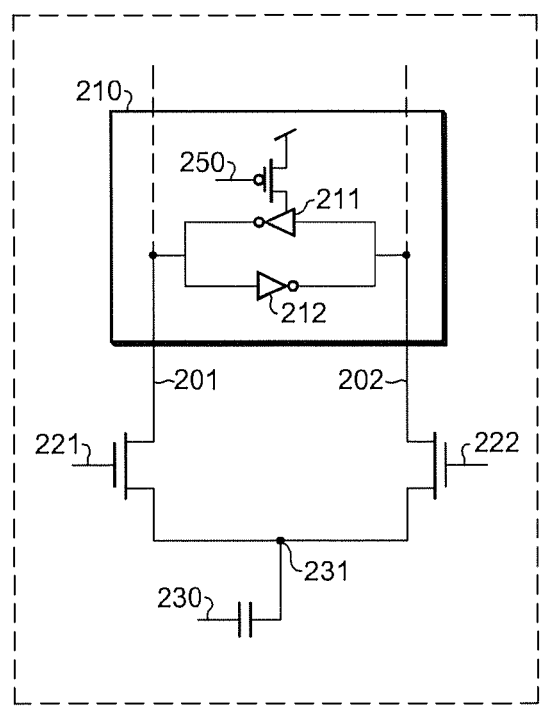
FIG. 2 is a schematic drawing illustrating a sense circuit for a semiconductor memory device in accordance with another embodiment of the present invention.

FIG. 2 shows a further embodiment of the present invention. Accordingly, a sense circuit 200 includes a sense amplifier 210. The sense amplifier 210 is a positive feedback circuit including two cross-coupled inverters 211, 212 connected to a first connecting line 201 and a second connecting line 202. The positive feedback circuit is enabled by a p-channel transistor 250 driven by a driving voltage $V_{dd}$ that may correspond to a high state of the memory cell. The sense circuit 200 further includes a first and a second n-channel transistor 221, 222 functioning as switching elements.

Further, the sense circuit 200 includes a capacitor 230 as charge storing element. The capacitor 230 is capable of being driven by an enabling signal corresponding to the driving voltage $V_{dd}$. Based on the enabling signal, the capacitor 330 will discharge onto a node 231 so as to generate a predefined potential on the node 231. The switching transistors 221, 222 may be selectively enabled by the driving voltage $V_{dd}$ so as to connect the node 231 to either the first connecting line 201 or the second connecting line 202. Although in this embodiment, the switching transistors 221, 222 are described as n-channel transistor, this choice is not limiting and has to be considered only an example. Hence, any other kind of transistor capable of performing the switching function above described may be used alternatively. Moreover, also in this embodiment, the first and second connecting lines 201, 202 may be used as true bit line and complementary bit line.

Figure 3:
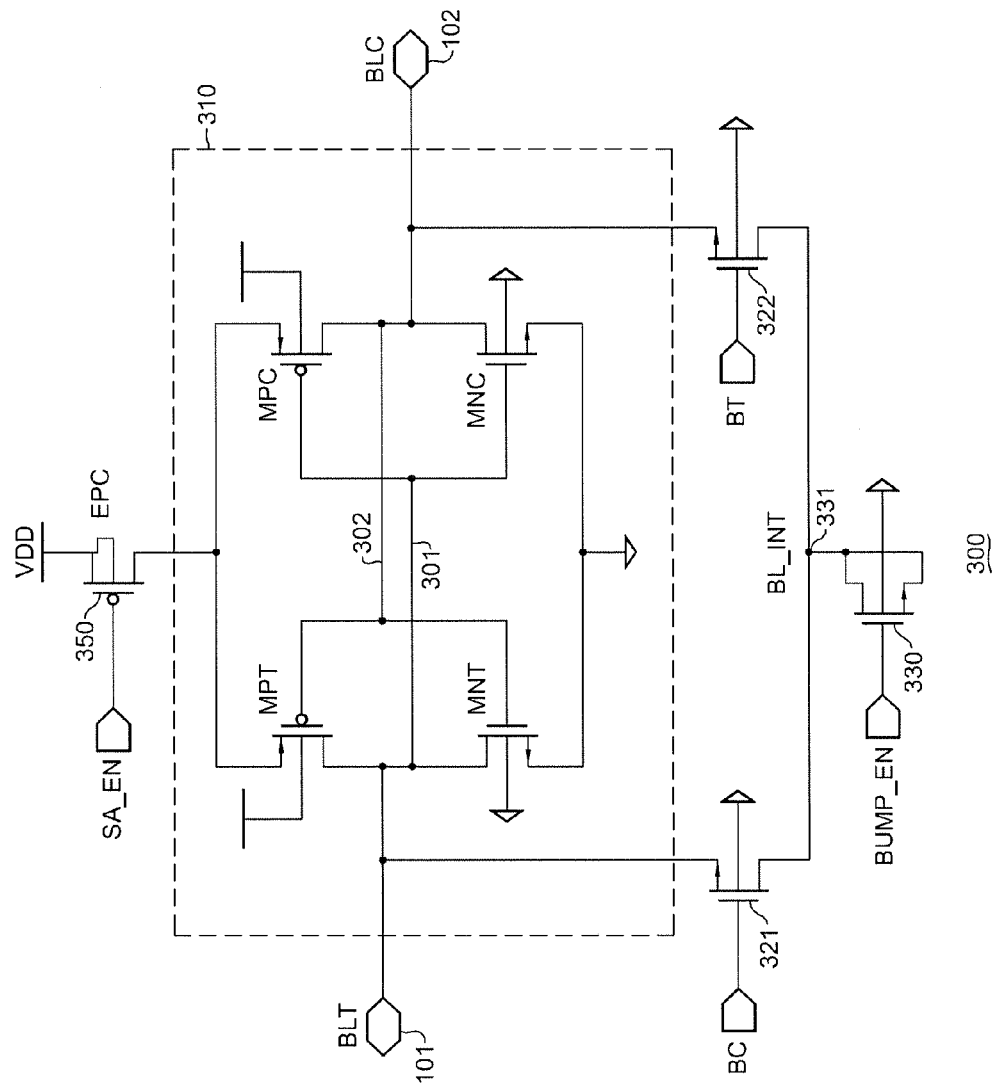
FIG. 3 is a schematic drawing illustrating a sense circuit for a semiconductor memory devices according to a further embodiment of the present invention.

FIG. 3 is a schematic drawing illustrating a sense circuit 300 according to an embodiment of the present invention. The sense circuit 300 includes a pair of p-channel transistors and a pair of n-channel transistors. An n-channel transistor MNC has its gate connected to a connecting line 301 and its drain connected to a connecting line 302. Further, an n-channel transistor MNT has its gate connected to the connecting line 302 and its drain connected to the connecting line 301. A p-channel transistor MPC has its gate connected to the drain of an N-channel transistor MNT, and its source connected to a supply voltage $V_{dd}$. Further, a p-channel transistor MPT has its gate connected to the transistor MNC, its drain connected to the drain of transistor MNP and its source connected to the supply voltage $V_{dd}$ through an enabling transistor EPC. The transistors MPC and MNC form a first inverter connected to the connecting lines 301 and 302 and the pair of transistors MPT and MNT form a second inverter. As apparent from the above description and FIG. 3, the four transistors MPT, MNT, MPC and MNC are cross-coupled so as to form a sense amplifier 310 connected to the connecting lines 301 and 302. The sense circuit 300 further includes a charge storing element which may be a MOS n-channel capacitor 330. The capacitor 330 is enabled by the potential $V_{dd}$ and is further connected to a circuit node 331.

The circuit node 331 is connected to the connecting lines 301 and 302 by means of two n-channel transistors, respectively. More precisely, a first n-channel transistor 321 connects the circuit 331 with the connecting line 301, and a second n-channel transistor 322 connects the circuit node 331 with the connecting line 302. During operation, the capacitor 330 is driven by the driving signal $V_{dd}$ and one of the n-channel transistors 321, 322 is selectively enabled so as to connect the internal node 331 with either one of the two connecting lines 301 and 302. The driving signal for driving the transistors 321, 322 may be a "high" level given by the reference potential $V_{dd}$. Moreover, the sense amplifier 310 is activated by driving the p-channel transistor EPC with a "low signal" $SA_{EN}$, thereby connecting the drain of the transistors MPT and MPC with the reference voltage $V_{dd}$. Also in this embodiment, the first and second connecting lines 301, 302 may be used as true bit line and complementary bit line.

Figure 4:
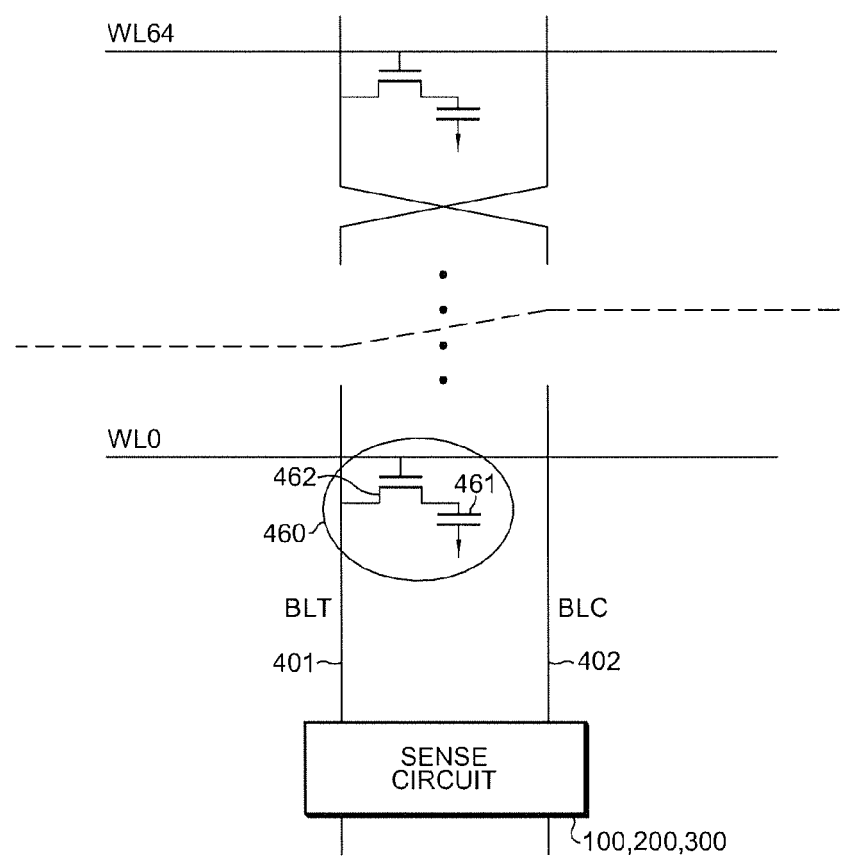
FIG. 4 is a schematic drawing illustrating a memory circuit in accordance with the embodiment of the present invention.

FIG. 4 illustrates a memory circuit 400 including a sense circuit 100, 200, 300 according to one of the embodiments of the present invention. In particular, the memory circuit includes a plurality of memory cells 460. Each memory cell 460 includes a transistor 461 connected to the first connecting line 401 or the second connecting line 402. The first and second connecting lines 401 and 402 are bit lines for transferring a bit signal from/to a memory cell 460. The transistor 462 is further connected to a third line WL0 intersecting the connecting lines 401 and 402 so as to form a grid. The memory cell 460 further includes a capacitor 461 for storing a charge corresponding to a bit value and said capacitor 461 is connected to one of the bit lines 401 and 402 through the transistor 462. The memory cell 400 has a twisted designed, according to which, the bit lines 401 and 402 are twisted at a fraction of the total length of the memory circuit 400. According to FIG. 4, the memory circuit 400 may have a twist after the word line WL63. However, other designs, wherein the bit lines are twisted according to different schemes are possible.

During a reading/writing operation of the memory cell 400, the "high" level $V_{dd}$ is fed into the transistor 462 through the word line WL0. Accordingly, the transistor 462 becomes conducting, thereby connecting the capacitor 461, in which a bit value is stored, to the bit line 401. At the same time, the charge storing element 130, 230, 330 in the sense circuit 100, 200, 300 is enabled by the "high" level $V_{dd}$, thereby generating a potential on the internal node 131, 231, 331. The voltage is selectively transferred from the internal node 131, 231, 331 to the bit lines 401, 402 using the transistors 120, 220, 320 as pass gates.

In the memory circuit 400 illustrated in FIG. 4, during a read operation from memory cells connected to the word lines WL0 to WL63, the switching element 121, 221, 321 is fed with a potential corresponding to a "low" enable signal, while the switching element 122, 222, 322 is fed with the "high" value $V_{dd}$. The "low" enable signal may be ground. On the contrary, during a read operation from memory cells connected to the word lines WL64 to WL127, the switching elements 121, 221, 321 and 122, 222, 322 are respectively fed with a "high" and "low" signal. Subsequently, the sense amplifier 110, 210, 310 is switched on by feeding the transistor EPC with a "low" signal. In the following, the operation of the memory circuit 400 will be described with respect to a reading/writing operation of the bits "1" and "0".

Firstly, the case, wherein the memory cell 460 stores the bit "1" will be described. In this situation, the memory capacitor 461 in the memory cell 460 is at the potential $V_{dd}$ before the word line is turned on. When the word line is turned on, the transistor 462 connects the capacitor 461 to the bit line 401. Consequently, the capacitor 461 will discharge on the bit line 401, which is pre-charged at ground. The discharging of the capacitor 461 will induce a potential on the bit line 401. This potential depends on the overall capacitance of the bit line 401 and the capacitance of the storing element 461. The potential $V_{BLT}$ measured on the bit line 401 is given by equation (2.2) below.

At the same time, on the complementary bit line 402 is transferred a potential generated by the charge storing element 130, 230, 330. More precisely, the potential of the complementary bit line 402 depends on the capacitance of the charge storing element 130, 230, 330, on the overall capacitance of the complementary bit line 402, and on the difference between the reference potential $V_{dd}$ and the threshold voltage $V_{tn}$ of the switching element 122, 222, 322. To conclude, the potential $V_{BLC}$ on the complementary bit line 402 is given by equation (2.1) below.

$$V_{BLC} = (C_{CSE}/(C_{BLC}+C_{CSE})) \cdot (V_{dd}-V_{tn}) \quad (2.1)$$

$$V_{BLT} = (C_{mem}/(C_{BLT}+C_{mem})) \cdot V_{dd} \quad (2.2)$$

$$V_{BL} = V_{BLT} - V_{BLC} \quad (2.3)$$

$$SWPT_1 = V_{BLC} \quad (2.4).$$

In the set of equations (2.1)-(2.4), $V_{BLT}$ and $V_{BLC}$ are the signals on the true bit line and the complementary bit line, respectively; $C_{CSE}$ is the capacitance of the charge storing element 130, 230, 330; $C_{BLT}$ and $C_{BLC}$ respectively are the capacities on the true and complementary bit lines, which are also called in the application first and second conducting lines 101, 201, 301, 401, 501 and 102, 202, 302, 402, 502; $V_{dd}$ and $V_{tn}$ are the driving potential corresponding to a high logic state of the memory and the threshold voltage of the charge storing element 130, 230, 330; and $SWPT_1$ is the switching point for the bit "1".

The capacitance of the charge storing element 130, 230, 330 may be smaller than the capacitance of the storing element 461, such that the voltage on the bit line 401 is larger than the voltage on the bit line 402. Advantageously, the capacitance of the charge storing element 130, 230, 330 may be chosen as being half of the capacitance of the storing element 461.

During a refresh procedure of a "0" bit, the storing cell 461 is at 0 before turning on the word line WL0. In this case, when the word line is turned on, no signal will appear on the bit line 401. At the same time, the charge storing element 130, 230, 330 is enabled so as to generate a predetermined potential on the circuit node 131, 231, 331. Said potential is transferred on the bit line 402 through the switching element 122, 222, 322 so as to generate on the bit line 402, the potential $V_{BLC}$ given by equation (2.1). Consequently, the sense amplifier may modify the signal on the bit lines 401, 402 so as to traduce the signal on the bit line 401 to a "low" logic value and the signal on the bit line 402 to a "high" logic value.

$$V_{BLC} = (C_{CSE}/(C_{BLC}+C_{CSE})) \cdot (V_{dd}-V_{tn}) \quad (3.1)$$

$$V_{BLT} = 0 \quad (3.2)$$

$$V_{BL} = V_{BLT} - V_{BLC} \quad (3.3)$$

$$SWPT_0 = V_{BLC} \quad (3.4).$$

In the set of equations (3.1)-(3.4), $V_{BLT}$ and $V_{BLC}$ are the signals on the true bit line and the complementary bit line, respectively; $C_{CSE}$ is the capacitance of the charge storing element 130, 230, 330; $C_{BLT}$ and $C_{BLC}$ respectively are the capacities on the true and complementary bit lines, which are also called in the application first and second conducting lines 101, 201, 301, 401, 501 and 102, 202, 302, 402, 502; $V_{dd}$ and $V_{tn}$ are the driving potential corresponding to a high logic state of the memory and the threshold voltage of the switching elements 121, 231, 321 and 122, 222, 322; and $SWPT_0$ is the switching point for the bit "0".

As a result, in both cases, the bit lines 401 and 402 will be at two different finite potentials, so as to allow the sense amplifier 110, 210, 310 to properly traduce the signal from the memory cell 460 to a full logic value representing bits "1" or "0".

Figure 5:
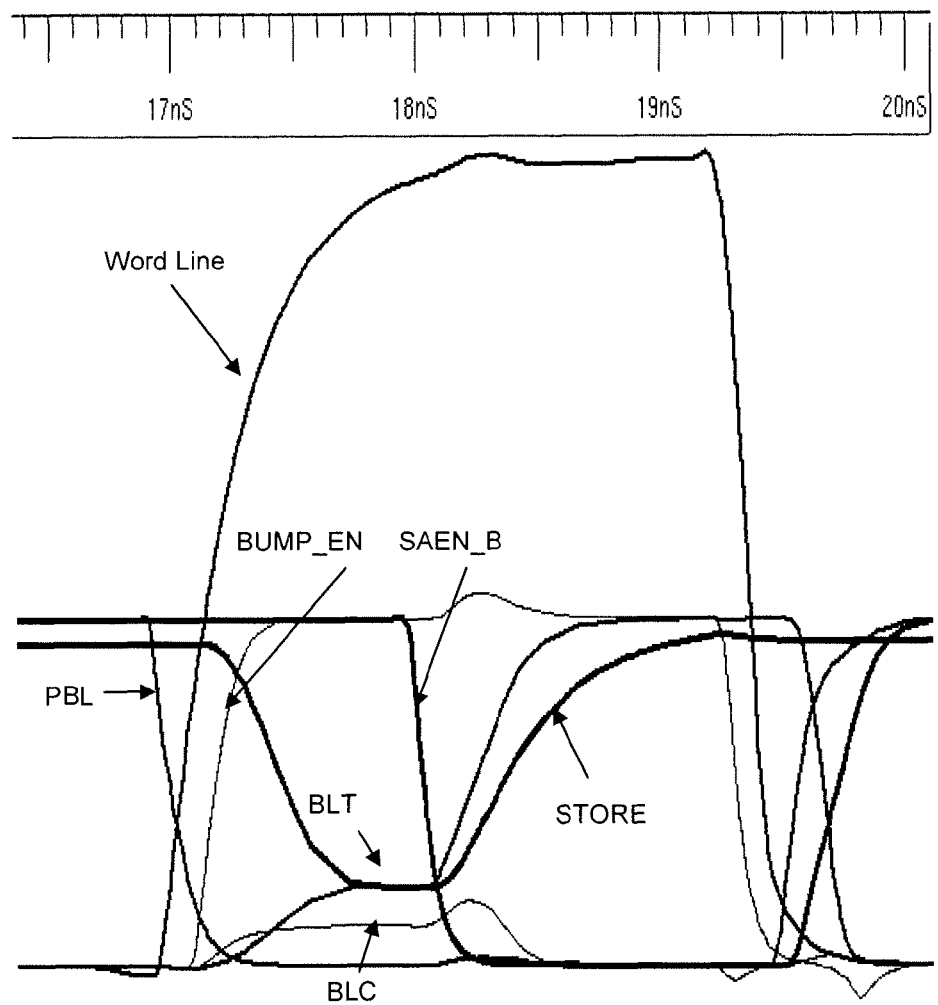
FIG. 5 is a plot illustrating a refresh operation of a signal representing a "1" bit.
Figure 6:
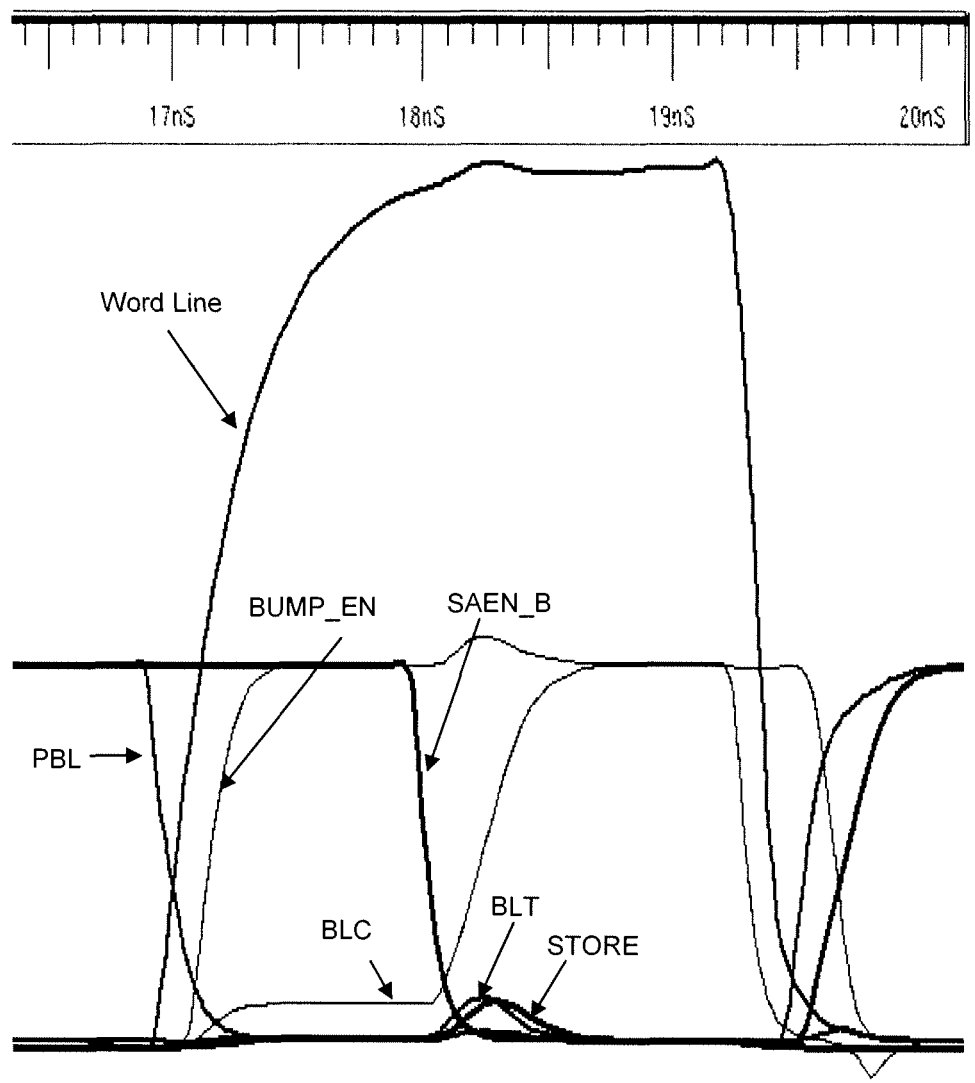
FIG. 6 is a plot illustrating a refresh operation of a signal representing a "0" bit.

The behavior of the signals on the word line WL0 and on the bit lines 401 and 402 as well as the behavior of the sense amplifier 110, 210, 310 during a refreshed procedure of the bits "1" and "2" are illustrated in FIGS. 5 and 6.

Figure 7:
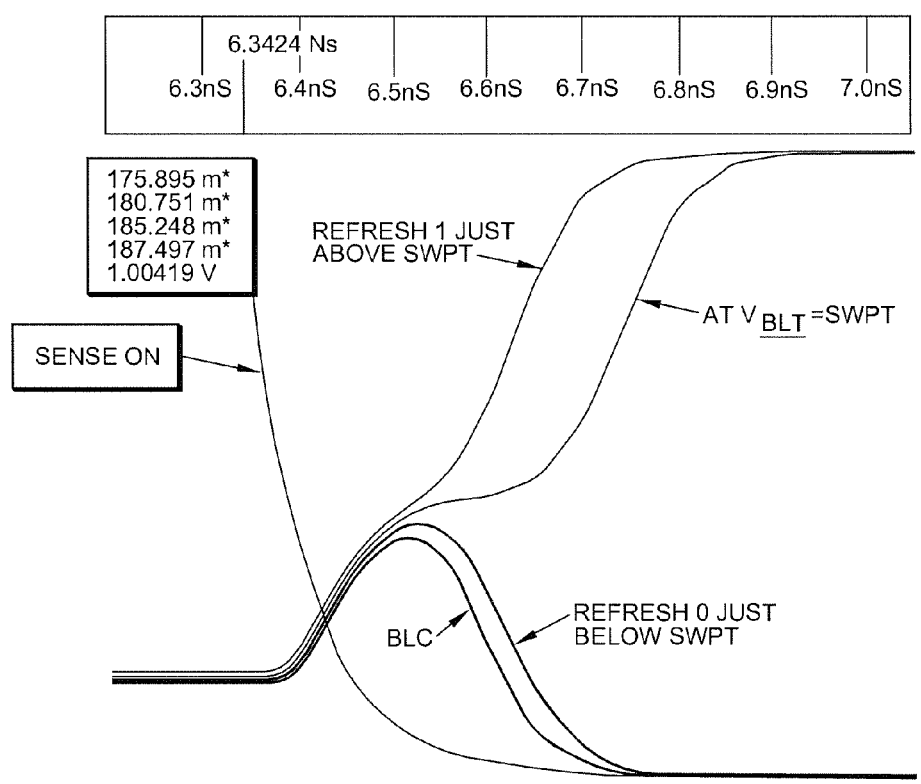
FIG. 7 is a plot illustrating the evolution in time of data signals at the switching point, below the switching point and above switching point.
Figure 8:
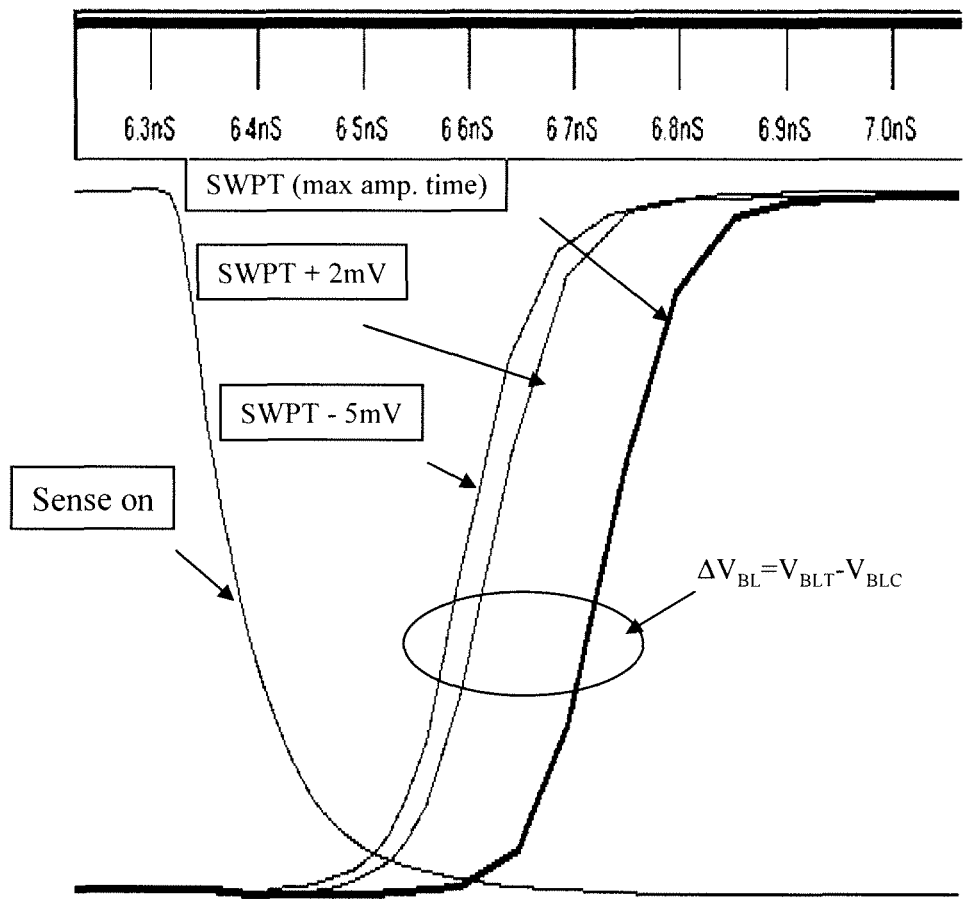
FIG. 8 is a plot illustrating the difference of the voltages of complementary bit lines at the switching point, below the switching point and above switching point.

FIGS. 7 and 8 illustrate the behavior of the switching points of the sense circuit according to the present invention. More precisely, as already defined above, the switching point represents the value of bit signal on the true bit line for which the amplification time is maximum and represents a "threshold" voltage used to sense whether a data signal is a logic "1" or a logic "0". More precisely, if the voltage value of the true bit line is below the switching point, the sense amplifier will traduce this voltage value to a logic "0". On the other hand, if the voltage value of the true line is above the switching point, the sense amplifier will traduce this value to a logic "1". The potential value on the complementary bit line will of course be opposite to the voltage on the true bit line.

FIG. 7 shows the behavior of the potential value on the bit lines 101, 201, 301, 401, 501 and 102, 202, 302, 402, 502 with respect to the switching point. In particular, if the signal on the true bit line is below the switching point, the signal will be traduced in a relatively short time to a "0" bit, whereas if the signal on the true bit line is above the switching point, this value will be traduced in a logic "1". The time needed to traduce the signal on the true bit line to a logic "1" or "0" varies depending on how close is the signal value on the true bit line to the switching point. In the limit case that the signal on the true bit line coincides with the switching point, the sense amplifier will need a maximum time in order to output a logic state.

FIG. 8 shows a plot illustrating the behavior of the voltage difference between the bit lines 101, 201, 301, 401, 501 and 102, 202, 302, 402, 502 at different values of the signal on the true bit line centered on the switching point. As it appears clear from this plot, if the value of the signal on the true bit line is below or above the switching point, the absolute value of the difference between the voltages on the true bit line and on the complementary bit line reach a maximum value in a short time compared with the case where the value of the signal on the true bit 101 coincides with the switching point.

Ideally, the switching point coincides with the potential value on the complementary bit line (see equations 2.1 and 3.1). However, this value may be slightly higher or lower than the potential on the complementary bit line depending on the static offset. Finally, if the value of the signal on the true bit line coincides with the switching point, the amplification time may also be infinite.

The behavior of the switching point has a critical impact on the performance of a sense amplifier. More precisely, it is desirable that the value of the switching point is very stable across all the Process-Voltage-Temperature parameters (PVTs). In order reliably read information as logic states, the switching point should lie into a well defined range, which also depends on the manufacture of the local device. Generally, for memory devices including sense amplifiers commonly used in the art, a range of about 30 mV for the standard deviation of the switching point has to be considered. This variation of the switching point is mainly due to static capacitive mismatch and coupling between the "true" bit line and the "complementary" bit line. On top of this, it is also necessary to take into account about 5 standard deviations for local device variation (~50 mV), a margin of about 30 mV for the signal on the data bit line (true bit line) that allows to write the information stored in a memory cell as a logic "1", and a margin of about 10 mV for the signal on the data bit line (true bit line) that allows to write the information stored in a memory cell as a logic "0".

The standard deviation of the switching point in the sense circuit 100, 200, 300 of the present invention is very controlled across the PVTs and is below 10 mV. Therefore, the sense amplifier of the present invention allows always assigning the signal values on the data bit lines (BLT) to a specified logic level.

Figure 9:
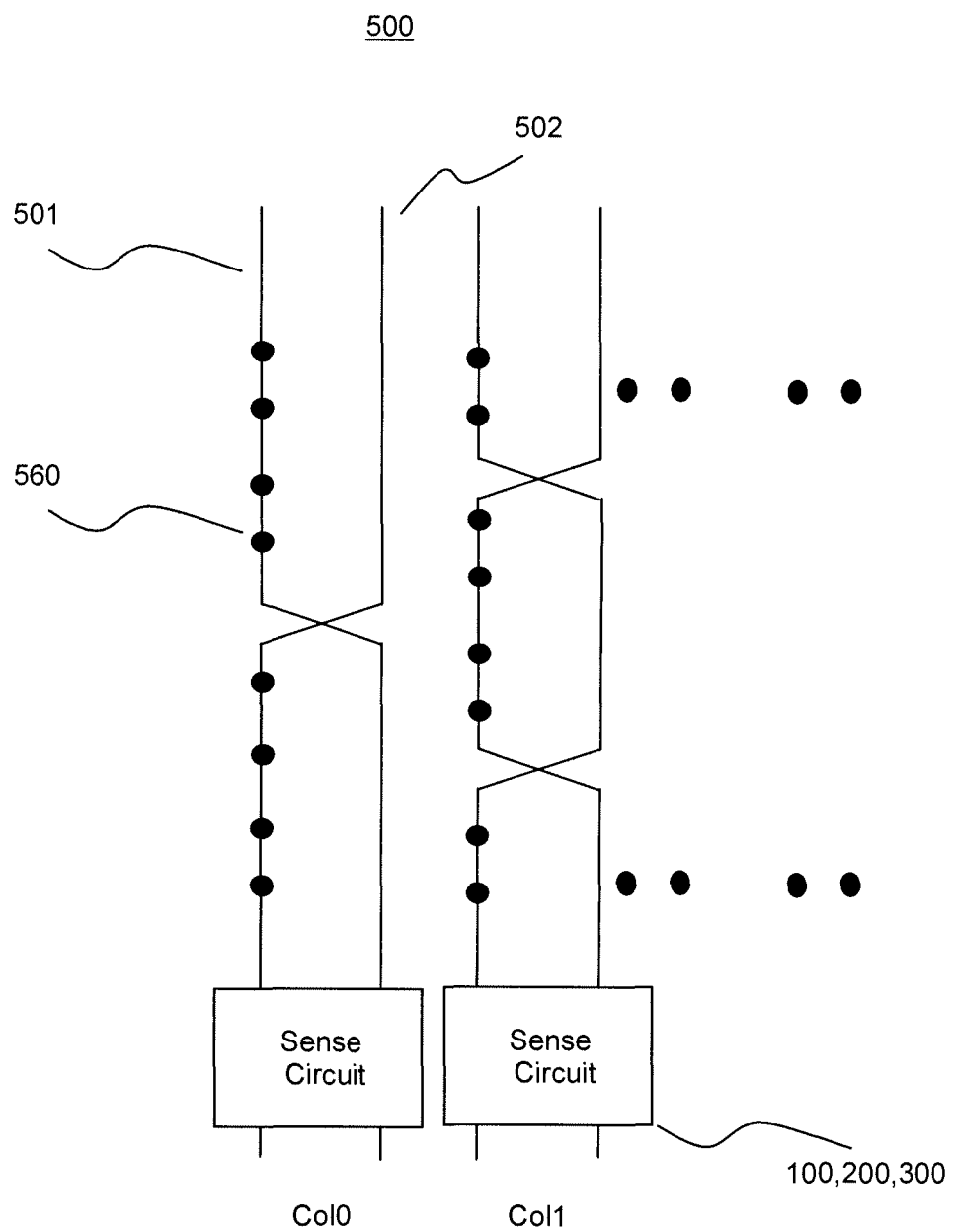
FIG. 9 is a schematic drawing illustrating a semiconductor memory device according to the present invention.
Figure 10:
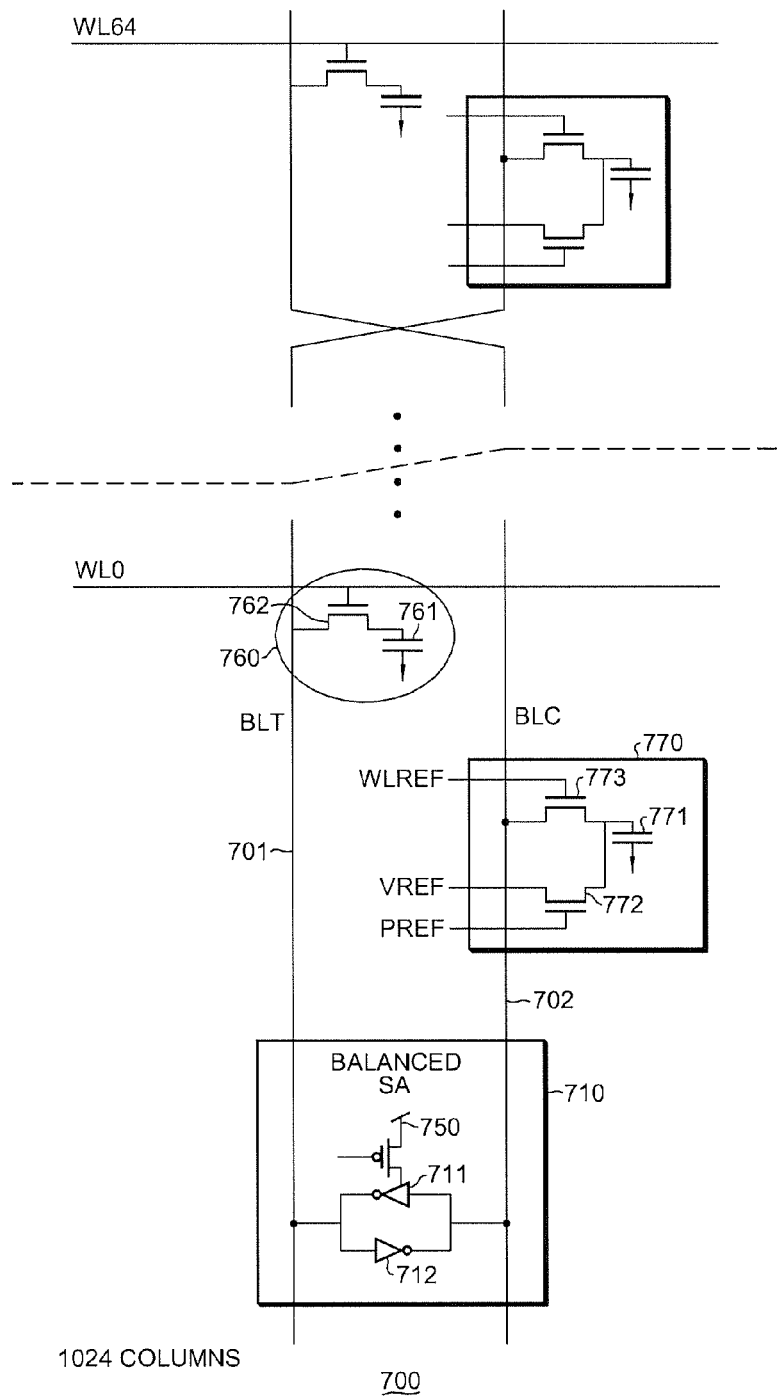
FIG. 10 is a schematic drawing illustrating a memory circuit in accordance with the state of the art.
Figure 11:
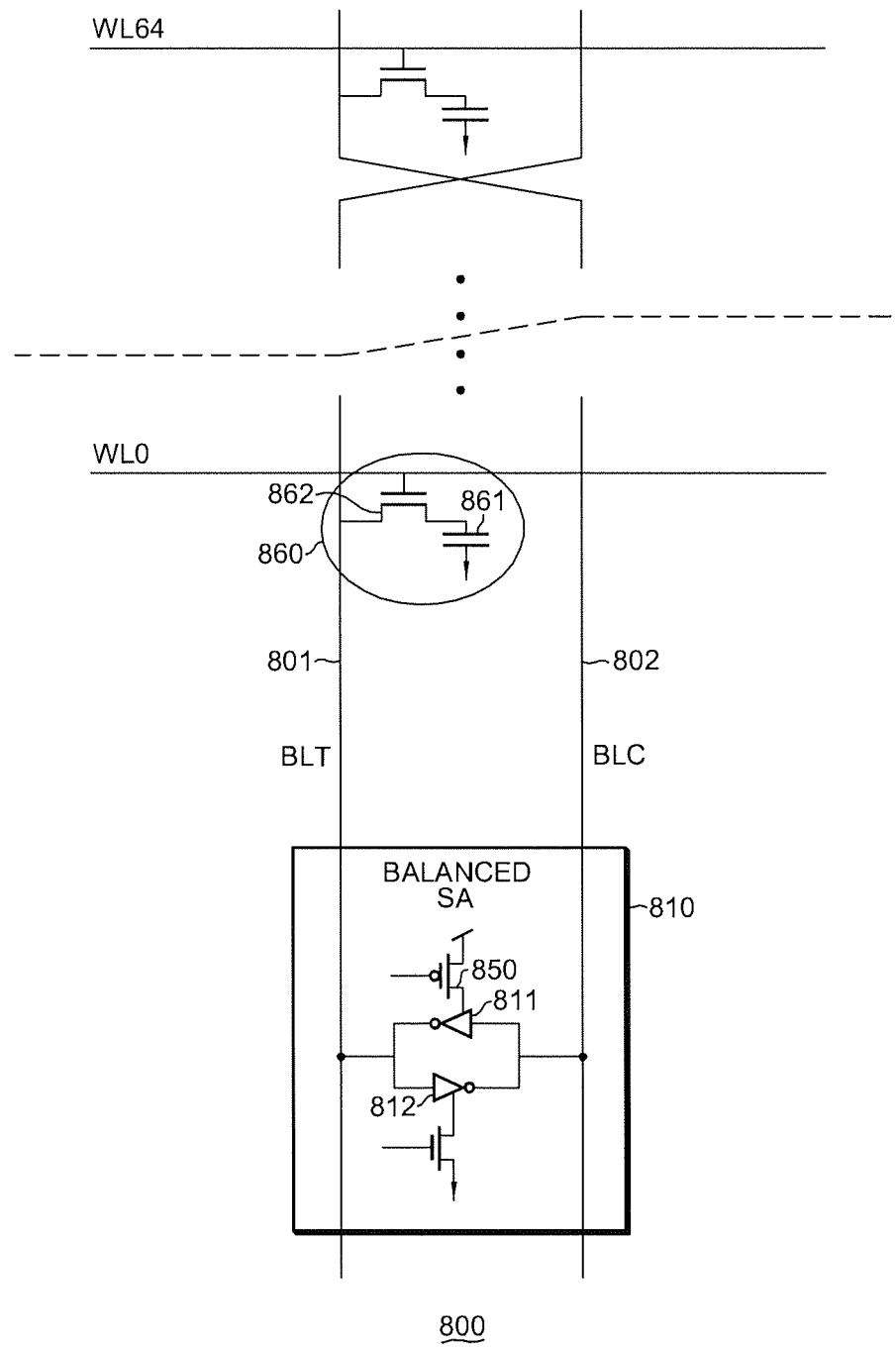
FIG. 11 shows a schematic drawing illustrating another example of memory circuit according to the state of the art.
Figure 12:
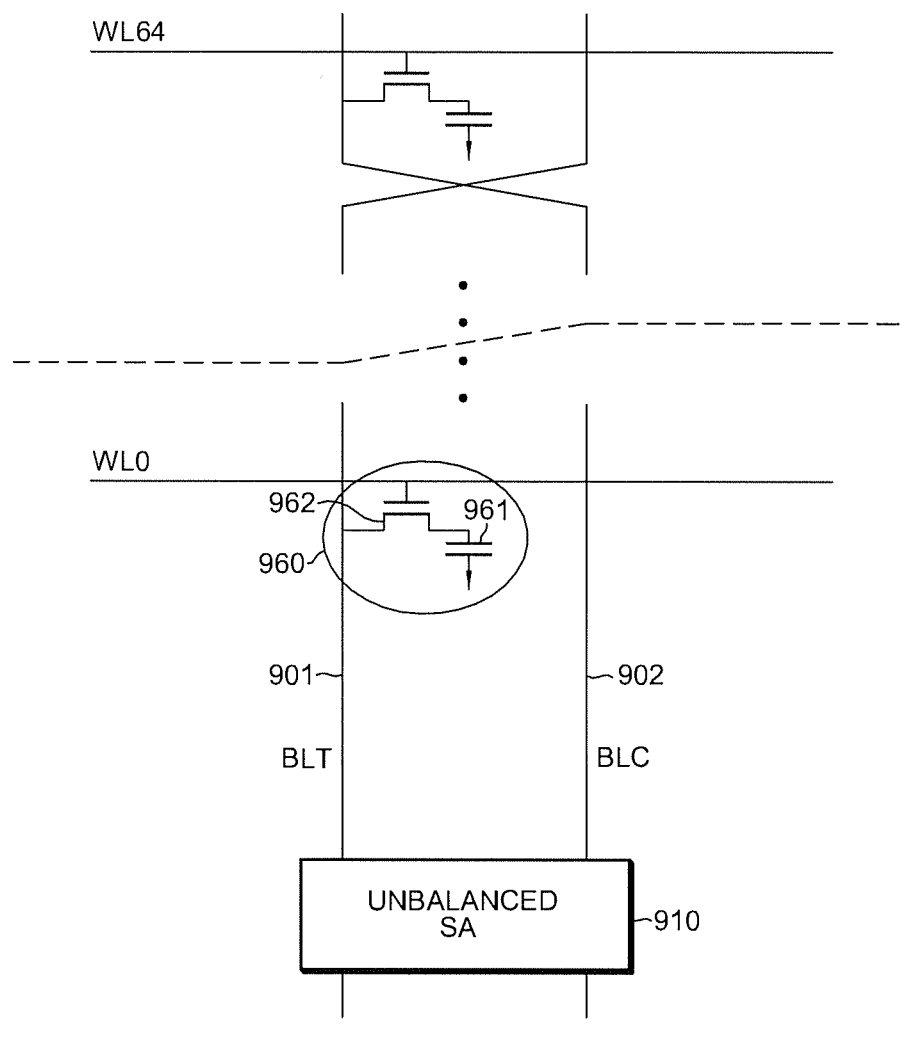
FIG. 12 is a schematic drawing illustrating a further memory circuit in accordance with the state of the art.

FIG. 9 is a schematic drawing illustrating a memory device 500 including the sense circuit of the present invention. In particular, although only two columns (Col0 and Col1) are shown, the memory device may include a plurality of such columns. Each column is connected to the sense circuit 100, 200, 300 according to the present invention and includes a plurality of memory cells connected either to a bit line 501 or to a bit line 502. In addition, the bit lines of each column may be twisted according to a predefined scheme.

Thus, the present invention relates to a sense circuit for use in a semi-conductor memory device capable of assigning logical values to signals read out from a memory cell in a stable and controllable manner while reducing the complexity of the sense circuit. In particular, a finite potential is generated from a charge storing element and is selectively induced on either one of the bit lines of the sense circuit so as to allow a sense amplifier to reliably read out a specified logic level.

While there have been described above the principles of the present invention in conjunction with specific implementations of a ferroelectric memory in accordance with the present invention, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

The invention claimed is:

1. A sense circuit for use in a semiconductor memory device, the sense circuit comprising:
a first and a second conducting line for conducting a bit signal from/to a memory cell;
a sense amplifier coupled to the first and second conducting line, said sense amplifier being adapted to sense a bit signal;
a charge storing element adapted to generate a predefined voltage; and
a first and a second switching element respectively coupled to the first and second conducting lines, wherein:
said first and second switching elements are selectively controllable to respectively couple the first and second conducting line to the charge storing element so as to induce the generated predefined voltage on the first or second conducting line and wherein the first and the second conducting line are pre-charged at ground.

2. The sense circuit of claim 1, wherein the first and second switching elements are adapted to be driven by a driving voltage corresponding to a high state of the memory cell.

3. The sense circuit of claim 1, wherein the charge storing element is adapted to be driven by a driving voltage corresponding to a high state of a memory cell.

4. The sense circuit of claim 1, wherein the charge storing element is a capacitor.

5. The sense circuit of claim 2, wherein the predefined voltage depends on the driving voltage.

6. The sense circuit of claim 2, wherein the predefined voltage is smaller than the driving voltage.

7. The sense circuit of claim 1, wherein one of the first or second conducting lines is adapted to conduct a first signal and the remaining one of the first and second conducting lines is adapted to conduct a second complementary signal based on the generated predefined voltage.

8. The sense circuit of claim 7, wherein the first signal is non-zero and the second complementary signal is lower than the first signal.

9. The sense circuit of claim 1, wherein the sensing circuit is a sense amplifier comprising a positive feedback circuit including two cross-coupled inverters coupled to the first and second conducting line.

10. The sense circuit of claim 1, wherein the sense amplifier is a balanced sense amplifier.

11. The sense circuit of claim 2, wherein the first and second switching elements are transistors, a gate of said transistors is selectively driven by the driving voltage, the source of said transistors is respectively coupled to the first and second connecting line, and a drain of said transistors is coupled to the charge storing element.

12. The sense circuit of claim 1, wherein the charge storing element is a MOS capacitor.

13. The sense circuit of claim 11, wherein the first and second switching elements are n-channel transistors.

14. A memory circuit comprising a plurality of memory cells selectively connectable to the sense circuit of claim 1 by the first and second connecting lines.

15. The memory circuit of claim 14, wherein the first and second switching elements are adapted to be driven by a driving voltage corresponding to a high state of the memory cell.

16. The memory circuit of claim 14, wherein the charge storing element is a MOS capacitor.

17. The memory circuit of claim 14, wherein the predefined voltage depends on a driving voltage corresponding to a high state of the memory cell.

18. The memory circuit of claim 14, wherein the predefined voltage is smaller than a driving voltage corresponding to a high state of the memory cell.

19. The memory circuit of claim 14, wherein the first and the second conducting line are pre-charged at ground.

20. The memory circuit of claim 14, wherein the sense amplifier comprises a positive feedback circuit including two cross-coupled inverters coupled to the first and second conducting line.

21. The memory circuit of claim 14, wherein the memory cell comprises a storing cell and a cell switching element, said cell switching element connecting the storing cell to the first or second conducting lines.

22. The memory circuit of claim 21, wherein the storing cell is a memory capacitor and the cell switching element is a transistor.

23. The memory circuit of claim 22, wherein one of the first or second conducting lines is adapted to conduct a first signal based on the voltage of the memory capacitor and the remaining one of the first and second conducting lines is adapted to conduct a second complementary signal based on the generated predefined voltage.

24. The memory circuit of claim 23, wherein the memory capacitor is at the driving voltage and the second complementary signal is lower than the first signal.

25. The memory circuit of claim 16, wherein the capacitance of the MOS capacitor is half of the capacitance of the memory capacitor.

26. A semiconductor memory device including a plurality of memory circuits according to claim 14.

27. The semiconductor memory device of claim 26, wherein the first and second conducting lines of each memory circuit are twisted.

28. A sense circuit for use in a semiconductor memory device, the sense circuit comprising:
a first and a second conducting line for conducting a bit signal from/to a memory cell;
a sense amplifier coupled to the first and second conducting lines, said sense amplifier being adapted to sense a bit signal;
a charge storing element adapted to generate a predefined voltage; and
a first and a second switching element respectively coupled to the first and second conducting lines, wherein:
said first and second switching elements are selectively controllable to respectively couple the first and second conducting lines to the charge storing element so as to induce the generated predefined voltage on the first or second conducting line, wherein one of the first or second conducting lines is adapted to conduct a first signal and the remaining one of the first and second conducting lines is adapted to conduct a second complementary signal based on the generated predefined voltage, and wherein the first signal is non-zero and the second complementary signal is lower than the first signal.

29. A sense circuit for use in a semiconductor memory device, the sense circuit comprising:
a first and a second conducting line for conducting a bit signal from/to a memory cell;
a sense amplifier coupled to the first and second conducting lines, said sense amplifier being adapted to sense a bit signal;
a charge storing element adapted to generate a predefined voltage; and
a first and a second switching element respectively coupled to the first and second conducting lines, wherein:
said first and second switching elements are selectively controllable to respectively couple the first and second conducting lines to the charge storing element so as to induce the generated predefined voltage on the first or second conducting line, wherein the first and second switching elements are adapted to be driven by a driving voltage corresponding to a high state of the memory cell, wherein the first and second switching elements are transistors, a gate of said transistors is selectively driven by the driving voltage, the source of said transistors is respectively coupled to the first and second connecting lines, and a drain of said transistors is coupled to the charge storing element, and wherein the first and second switching elements are n-channel transistors.

* * * * *